US005923945A

United States Patent [19]

Eisman et al.

[11] Patent Number: 5,923,945

[45] **Date of Patent: *Jul. 13, 1999**

[54] METHOD OF PREPARING COATED NITRIDE POWDER AND THE COATED POWDER PRODUCED THEREBY

[75] Inventors: Glenn A. Eisman, Midland, Mich.; Selim Yalvac, Lake Jackson, Tex.; Robert A. Kirchhoff; Kevin E. Howard, both of Midland, Mich.; Brian M. Banker, Midland, Mich.; Matthew R. Kesterson, State College, Pa.

[73] Assignee: The Dow Chemical Company, Midland, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/748,301

[22] Filed: Nov. 13, 1996

Related U.S. Application Data

[51] Int. Cl.[6] .................... B05D 7/00

[52] U.S. Cl. .................... 428/552; 427/215; 427/220; 427/372.2

[58] Field of Search .................... 427/212, 215, 427/220, 372.2; 428/552

[56] References Cited

U.S. PATENT DOCUMENTS

| | | | |
|---|---|---|---|
| 4,163,074 | 7/1979 | Ebata et al. . | |
| 4,626,451 | 12/1986 | Tanaka et al. . | |
| 4,834,928 | 5/1989 | Su | 264/56 |
| 4,961,913 | 10/1990 | Sullivan | 501/87 |
| 5,034,357 | 7/1991 | Yamakawa et al. . | |
| 5,085,923 | 2/1992 | Yamakawa et al. . | |
| 5,120,611 | 6/1992 | Ogura | 427/126.6 |
| 5,229,243 | 7/1993 | Sasaki et al. | 430/109 |
| 5,246,895 | 9/1993 | Lesher et al. | 501/89 |
| 5,252,249 | 10/1993 | Kurachi et al. | 252/71 |
| 5,273,699 | 12/1993 | Knudsen et al. . | |
| 5,649,278 | 7/1997 | Dunmead et al. | 501/96.3 |

*Primary Examiner*—Shrive Beck
*Assistant Examiner*—Bret Chen

[57] ABSTRACT

The invention is a process for the preparation of coated nitride powder, comprising contacting one or more metal complex(es), organo-aluminum material, optionally one or more silicon compounds or mixtures thereof, with nitride powder under conditions such that coated nitride powder is formed. A metal complex is a metal-containing system which is soluble in a host liquid. The process of the invention is a process for making coated nitride powder and obtaining the desirable properties of coated nitride powder, while maintaining the desirable properties of the uncoated powder, such as good thermal conductivity, for use in electronic applications. In another aspect, the invention is a coated nitride powder which has the advantageous properties of the uncoated powder and is a desirable alternative to current nitride coatings.

20 Claims, No Drawings

METHOD OF PREPARING COATED NITRIDE POWDER AND THE COATED POWDER PRODUCED THEREBY

BACKGROUND OF THE INVENTION

The invention relates to a process for preparing a coated nitride powder and the product produced thereby. Preferably, this invention further relates to a process for preparing coated aluminum nitride powders and the coated aluminum nitride powders produced thereby.

Nitride powder has good thermal conductivity, making it useful in aiding in the dissipation of heat from electronic devices. Coated nitride powders that are moisture-resistant are useful as a filler material for thermally-conductive polymer composites used as heat sink materials in the electronics industry. Untreated nitride powder can undergo hydrolysis when the powder is contacted with moisture, making the untreated powder unacceptable for many electronics applications. The nitride powder must be resistant to hydrolysis during usage in electronics components.

It would be desirable to develop alternative coatings for nitride powders. It would be advantageous to develop a process for making the alternative coated nitride powders. It would be advantageous to obtain the desirable properties of coated nitride powders while maintaining the desirable properties of the uncoated powder, such as good thermal conductivity, for use in electronics applications. It would also be advantageous to advance the coating technology of nitride powders by further developing a nitride powder that is moisture-resistant thus providing a protective layer on the surface of the powder.

SUMMARY OF THE INVENTION

The invention is a process for the preparation of coated nitride powder, comprising contacting one or more metal complex(es), organo-aluminum material, or mixtures thereof, and, optionally, one or more silicon compounds, with nitride powder under conditions such that coated nitride powder is formed. A metal complex is a metal-containing system which is soluble in a host liquid.

The process of the invention is a process for making coated nitride powder and obtaining the desirable properties of coated nitride powder, while maintaining the desirable properties of the uncoated powder, such as good thermal conductivity, for use in electronics applications. In another aspect, the invention is a coated nitride powder which has the advantageous properties of the uncoated powder and is a desirable alternative to current nitride coatings.

DETAILED DESCRIPTION OF THE INVENTION

The starting materials (hereinafter starting materials) for the process of preparing the coated nitride powder of the invention can include nitride powder; one or more of the metal complex(es); one or more of the organo-aluminum material or mixtures thereof; and optionally, one or more silicon compounds. All or some of these starting materials can be contacted under conditions such that a coated nitride powder is formed.

The coated nitride powder prepared by this invention has a coating on at least a portion of the surface of the particles in the powder. Preferably, the coated nitride powder has a coating on the entire surface of the powder particles. The starting materials are chosen based on the desired elemental content of the resultant coating on the powder particles. For example, if it is desired to obtain a coating of lanthanum, silicon, oxygen and aluminum on aluminum nitride powder, a metal complex such as lanthanum nitrate is used in combination with tetraethylorthosilicate to coat the powder particles. The aluminum is from the aluminum nitride powder. The desired elemental content of the coating can be dictated by such factors as cost and availability of the starting materials. An oxygen-containing layer is generated by the application of the metal complex(es), the organo-aluminum material or mixtures thereof, with the optional silicon compound on the nitride powder.

The coating is of a thickness that permits the powder to be used in applications calling for coated nitride powders. Preferably, the thickness of the coating is about 1 Angstrom or greater to about 1 micron or less. The amount of metal complex, organo-aluminum material or mixtures thereof, and optional silicon compounds used to coat the nitride powder should be sufficient to coat at least a portion of the powder, and preferably sufficient to completely coat the powder. Preferably, the total amount of the metal complex, organo-aluminum material, and optional silicon compound or mixtures thereof present is about 1 weight percent or greater, more preferably about 2 weight percent or greater, based on the weight of the nitride powder. Preferably, the total amount of metal complex, organo-aluminum material, and optional silicon compound or mixtures thereof present is about 10 weight percent or less, more preferably about 5 weight percent or less, based on the weight of the nitride powder.

The nitride powder used in the invention may be any nitride powder which can be coated and perform the desired function. The nitride powder used in the invention is preferably aluminum nitride, boron nitride, silicon nitride, or combinations thereof. Most preferably, the nitride powder is aluminum nitride. Preferably, the nitride powder used in this invention may be (a) a composite powder containing, among other compounds, aluminum nitride, boron nitride, silicon nitride or combinations thereof, wherein at least some of the nitride material is at the surface of the composite powder, or (b) a powder formed substantially of aluminum nitride, boron nitride, silicon nitride, or mixtures thereof. Preferably, the level of nitride powder in the composite powder is from about 10 weight percent to about 99 weight percent of the composite powder. In the composite powder, other materials can be combined with the nitride powder that do not change the desirable properties of the final coated powder, such as thermal conductivity. Examples of materials which could be combined with the nitride powders to form composite powders include ceramics and metals. Preferred materials are silicon carbide, titanium, aluminum, and silicon. The nitride powder which may be used in this invention is not limited in size or surface area.

A variety of metal complexes may be used to coat the nitride powder particles. The metal complex is typically formed by the union of a metal with an anionic species. The metal complex is one which is soluble in a host liquid. The metal complex may be deposited onto the nitride powder particles and then fired to permit the metal complex to interact with the surface of the nitride powder to form a coating on the surface of the nitride powder particles. Alternatively, the metal complex in combination with the organo-aluminum material or mixtures thereof and, optionally, the silicon compound is one which, when fired, produces a coating on at least a portion of the nitride powder particles. The metal of the metal complex(es) is able to provide a moisture-resistant layer over at least a portion of the nitride powder. Examples of metals useful in metal complexes are alkali earth metals, alkaline earth metals, transition metals, rare earth metals, lanthanides, IIIA elements, IVA elements and VA elements under the CAS notation, and combinations and mixtures thereof. Preferred metals for use in metal complexes are lithium, sodium, potassium, magnesium, calcium, strontium, scandium, yttrium, lanthanum, titanium, zirconium, hafnium, vanadium, niobium, tantalum, chromium, molybdenum, tungsten, manganese, iron, cobalt, nickel, copper, silver, gold, zinc, boron, aluminum, gallium, indium, silicon, tin, lead, phosphorus, bismuth, praseodymium, neodymium, samarium, europium, ytterbium, or combinations and mixtures thereof. More preferred metals for use in metal complexes are calcium, barium, copper, cobalt, lithium, sodium, zinc, magnesium, potassium, chromium, nickel, manganese, strontium, iron, yttrium, lanthanum, titanium or mixtures and combinations thereof. Most preferred metals are calcium, barium, lithium, sodium, zinc, potassium, manganese, yttrium, titanium, lanthanum, or combinations and mixtures thereof.

The anionic species is capable of combining with a metal to form a metal complex. Examples of anionic species are ligands, chelates or combinations thereof. Preferred anionic species are nitrate, acetate, fluoride, borate, phosphate, chloride, bromide, iodide or mixtures and combinations thereof. More preferred anionic species are nitrate, acetate, borate, phosphate or combinations and mixtures thereof.

The organo-aluminum materials are any aluminum alkoxides which will form a coating on the surface of the chosen powder particles. Preferred organo-aluminum materials are aluminum alkoxides or mixtures and combinations thereof. More preferred organo-aluminum materials are aluminum $C_{1-12}$ alkoxides. Even more preferred organo-aluminum materials are aluminum isopropoxide, aluminum isobutoxide or mixtures and combinations thereof. A most preferred material is aluminum isopropoxide.

The preparation of coated nitride powder can be performed with the use of silicon compounds in combination with one or more metal complexes and/or organo-aluminum compounds. Preferred silicon compounds are tetraalkyl silicates, metallic silicates, or metallic fluorosilicates. More preferred silicon compounds are tetraethylorthosilicate, tetramethylorthosilicate, tetra-n-propylorthosilicate, tetraisopropylorthosilicate, tetrabutylorthosilicate, hexamethoxydisiloxane, octamethoxytrisiloxane, sodium silicate, potassium silicate, ammonium silicate, cesium silicate, rubidium silicate, sodium fluorosilicate, potassium fluorosilicate, lithium fluorosilicate, calcium fluorosilicate, magnesium fluorosilicate, lead fluorosilicate, aluminum fluorosilicate, copper fluorosilicate, cobalt fluorosilicate, iron fluorosilicate, barium fluorosilicate, or mixtures and combinations thereof. A most preferred silicon compound is tetraethylorthosilicate (hereinafter referred to as TEOS). The performance of the silicon compounds in combination with one or more metal complexes and/or organo-aluminum compounds can optionally be enhanced with the use of silane coupling agents. A silane coupling agent improves the adhesive bond between the nitride powder and the silicon compounds. Silane coupling agents bridge the interface between the nitride powder and the silicon compound. Any silane coupling agent which performs this function can be used. Examples of silane coupling agents include vinyltrimethoxysilane, chloropropyltrimethoxysilane, 3-glycidoxypropyltrimethoxysilane, 3-methacryloxypropyltrimethoxysilane, 3-aminopropyltriethoxysilane, N-2-aminoethyl-3-aminopropyltrimethoxysilane, 3-mercaptopropyltrimethoxysilane, 3-(N-styrylmethyl-2-amino-ethylamino)propyltrimethoxysilane hydrochloride and beta-(3,4-epoxycylohexyl)ethyltrimethoxysilane.

Solvents are useful in this invention for facilitating the coating of the starting materials onto the surface of the nitride powder. Solvents useful in this invention are capable of dissolving one or more of the starting materials and assisting in the application of the metal complex(es), organo aluminum material or silicon compounds, or combinations and mixtures thereof onto the surface of the nitride powder particles. Preferred solvents are water or alcohols, such as aliphatic alcohols, alicyclic alcohols, aromatic alcohols, or mixtures and combinations thereof. More preferred solvents are ethanol, methanol, cyclohexanol, phenol, benzyl alcohol, or mixtures and combinations thereof. The boiling point of the solvent is preferably low enough to permit easy removal of the solvent from the mixture of the starting materials, but high enough to allow handling at room temperature. Preferably, the boiling point of the solvent is about 25° C. or greater, more preferably about 35° C. or greater, and even more preferably about 45° C. or greater. Preferably, the boiling point of the solvent is about 150° C. or less, more preferably about 100° C. or less, and even more preferably about 70° C. or less. The starting materials can be contacted with the solvent by any method known to one skilled in the art.

The process of the invention for preparing a coated nitride powder involves contacting the starting materials under conditions such that coated nitride powder is prepared. The metal complex(es), organo-aluminum material, or silicon compounds, or combinations and mixtures thereof, can be contacted directly with the nitride powder. If the optional silicon compound is used, the silicon compound can further be optionally combined with a silane coupling agent. The contacting of the starting materials can be performed by any method known to one skilled in the art.

One or more of the starting materials can be contacted with a solvent(s) prior, simultaneously or subsequently to contacting with the rest of the starting materials. For example, the nitride powder can initially be contacted with a solvent prior to contacting the nitride powder with a metal complex, organo-aluminum material, optional silicon compound, or mixtures thereof, or the nitride powder can be initially contacted with the other starting materials with solvent being added after the contacting. The time of contacting of the starting materials with the chosen solvent(s) is sufficient to permit the materials to dissolve in the solvent(s). The amount of solvent used is sufficient to permit contacting and solubilization of the starting materials. Preferably, the amount of solvent used is from about 50 volume percent to about 300 volume percent, based on the volume of the nitride powder. The starting materials can be contacted in any order.

The contacting of the metal complex(es), organo-aluminum material or mixtures thereof, and optional silicon compounds with the nitride powder such that a surface layer is formed on the powder, can be performed by any method known to one skilled in the art. Conventional methods of contacting include mixing, stirring, agitating, blending, chemical vapor deposition, electroless deposition, dip-coating, spray-on, and thermal decomposition. Preferred methods of contacting are mixing, stirring, agitating or blending. Mixing and other methods for contacting the starting materials allows for the liquid phase to be in contact with all surfaces of the nitride powder.

The time of contacting of the starting materials should be sufficient to insure homogenous mixing of the starting materials. The time of contact of the starting materials is preferably about 1 minute or greater, more preferably about 3 minutes or greater, and even more preferably about 5 minutes or greater. The time of contacting of the starting materials is preferably about 120 minutes or less, more preferably about 60 minutes or less, and even more preferably about 30 minutes or less. The temperature at which the contacting of the starting materials occurs should be sufficiently high enough that coating is evenly deposited onto the nitride powder, but below the boiling point of the solvent. Preferably, the temperature at which the contacting occurs is one which does not require complex processing equipment. The temperature is preferably about 10° C. or greater, and more preferably about 15° C. or greater. The temperature is preferably about 80° C. or less, and more preferably about 60° C. or less. The contacting can occur under ambient conditions, under a vacuum, or in an inert atmosphere. Preferably, the contacting can occur under ambient conditions.

If the starting materials have been contacted with the use of a solvent, the solvent can be removed from the starting materials by any method known to one skilled in the art. Examples of methods of solvent removal are drying under a vacuum, in a drying chamber, and under vacuum evaporation. The drying time of the starting materials should be sufficient to allow the solvent to evaporate as rapidly as possible without destroying the continuity of the surface of the coated nitride powder. Preferably, the drying time is about 20 minutes or greater, more preferably about 30 minutes or greater, and even more preferably about 45 minutes or greater. Preferably, the drying time is about 2880 minutes or less, more preferably about 1440 minutes or less, and even more preferably about 720 minutes or less. The drying temperature is the temperature at which the solvent is evaporated within the desired time. Preferably, the drying temperature is about 10° C. or greater, more preferably about 15° C. or greater, and even more preferably about 20° C. or greater. Preferably, the drying temperature is about 150° C. or less, more preferably about 100° C. or less, and even more preferably about 80° C. or less. Once the solvent is removed, a coating of the metal complex(es), organo-aluminum material, silicon compound or mixtures thereof remains on the surface of the powder particles.

Once the solvent is evaporated, the coating on the powder particles is subject to a thermal treatment. The thermal treatment is utilized to decompose the initial metal complex (es), organo-aluminum material, silicon compound or mixtures thereof, and cause a reaction with the surface of the nitride powder. The thermal treatment results in an interaction between the deposited metal complex, organo-aluminum material, or mixtures thereof, and optional silicon compounds and the nitride surface, thereby generating a new amorphous phase on the surface of the nitride powder. The amorphous phase is derived from the metal complex, organo-aluminum material or mixtures thereof and optional silicon compounds deposited on the surface of the nitride powder. During the thermal treatment, the thermally unstable compounds in the coating on the surface of the powder particles will evaporate, leaving the remaining materials in a coating on the surface of the powder particles. The extent of the thermal processing dictates the crystallinity of the coating. For example, the higher the firing temperature, the greater the crystallinity. For coatings which are fired below 1000° C., the coatings are generally amorphous. The temperature at which the coating may be fired should be sufficient to fix the coating onto the nitride powder and allow interaction between the coating and the powder. The interaction is a bond formation between the remaining elements in the coating and the powder particles. Preferably, the firing temperature is about 350° C. or greater, more preferably about 450° C. or greater, and even more preferably about 600° C. or greater. Preferably, the firing temperature is about 1500° C. or less, more preferably about 1000° C. or less, and even more preferably about 800° C. or less. The resultant powder can be fired for time sufficient to develop the coating on the nitride powder. Preferably, the firing time is about 10 minutes or greater, more preferably about 30 minutes or greater, and even more preferably about 60 minutes or greater. Preferably, the firing time is about 720 minutes or less, more preferably about 300 minutes or less, and even more preferably about 120 minutes or less. The heat treatment can occur in air, under a vacuum or in an inert atmosphere. Preferably, the heat treatment is carried out under an inert atmosphere such as nitrogen. Alternatively, if an oxygen environment is desired, the heat treatment is carried out in air.

The resultant coated material can be lightly ground into a powder if the thermally treated powder contains clumps. The light grinding such that a powder results can be performed by any method known to one skilled in the art. Examples of methods of grinding are grinding with ball mill, mortar and pestle, etc. A preferred method of grinding is with the use of a mortar and pestle. The material can be removed and stored by any method of storage known to one skilled in the art.

The resultant coating on at least a portion of the surface of the nitride powder can be capable of moisture resistance such that the powder is useful for electronic applications. The hydrophobic nature of the coating is determined using a water boil test. In this test, the newly coated nitride powder is boiled in water for 24 hours. The powder is dried, removed and a final weight is compared to an initial weight. Any increase in mass of the powder after the exposure to water is greatly reduced, as compared with an untreated nitride powder. A great increase in mass would be associated with the decomposition of nitride powder as a result of its reaction with water. Furthermore, the coatings retain structural integrity during compounding and the silicon based coatings are surface compatible with standard silica based resin formulations.

The resultant coated nitride powder is useful in applications requiring heat dissipation characteristics such as chip packaging. The resultant coated nitride powder can be used in any electronics application requiring a thermally conductive material that is also water resistant, such as epoxy based molding compound for encapsulating semiconductors, thermoset liquid resins for "glob-top" encapsulants, die-attach adhesives, and flip chip underfill and thermoplastic encapsulants for semiconductors.

ILLUSTRATIVE EMBODIMENTS OF THE INVENTION

The following examples are provided to illustrate the invention, but are not intended to limit the scope thereof. All parts and percentages are by weight unless otherwise indicated.

EXAMPLE 1

3.75 mL(3.5 grams) of TEOS (tetraethylorthosilicate) was dissolved in 13 mL of methanol. 18 mL (grams) of water were added to the TEOS mixture. Separately, calcium acetate ($Ca(OAc)_2$) was dissolved (see Table 1 below for amount) in 5 mL of water and 0.5 mL of acetic acid. The TEOS mixture and the calcium acetate mixture were mixed together and allowed to stand for 30 minutes. 35 grams of aluminum nitride powder (AlN) were added to the above mixture. The mixture was placed in a drying chamber at 40° C. The drying chamber had a nitrogen flow rate of 2 liters/minute. The sample was left in the chamber for 18 hours. Once dried, the powder was removed and ground with a mortar and pestle. The powder was then removed and placed in a Lindberg high temperature furnace. The furnace heat schedule was as follows: increase the temperature by 1° C./minute from room temperature to 120° C. and hold for 6 hours; increase the temperature by 5° C./minute to 600° C. and hold for 1.5 hours; and decrease the temperature by 50° C./minute until cool. During the heating schedule the nitrogen flow rate was set at 100 mL/minute. Upon finishing the heating schedule, the powder was then removed and stored. The water boil test was performed with no weight gain measured after following the previously discussed procedure for water boil testing. Analytical results indicated a coating of variable thickness which ranged from 35 to 1700 Angstroms. Elemental analysis of the coating showed amorphous Si, O and Ca. A water boil test was performed and no weight gain was measured.

TABLE 1

| AlN | TEOS | $Ca(OAc)_2$ |
|---|---|---|
| 35 grams | 3.5 grams | 0.18 grams |
| 35 grams | 3.5 grams | 0.37 grams |
| 35 grams | 3.5 grams | 0.92 grams |

EXAMPLE 2

0.44 grams of aluminum isopropoxide were dissolved in ethanol and stirred until complete dissolution took place, approximately 1 hour. In a separate container, 0.56 grams of barium acetate was dissolved in 90 mL of ethanol and stirred for 30 minutes. The two mixtures were then combined and stirred for 30 minutes. In a separate container, 20 grams of aluminum nitride powder were added to 20 mL of ethanol. To the vessel containing the aluminum nitride powder (AlN) and ethanol, the dissolved aluminum isopropoxide was added. Further stirring (30 minutes) took place, ensuring a homogeneous mixture. Following the stirring step the ethanol was allowed to evaporate. Once the AlN was considerably free of ethanol, the AlN was placed into a quartz boat and inserted into the cold furnace. The gaseous environment in the furnace was air. The furnace was heated to 450° C. and held at that temperature for 2 hours. The furnace was then allowed to cool, after which the AlN was removed. Upon analysis using TEM and XRF, it was determined that a coating of about up to 1000 Angstroms was found on the surface of the AlN.

EXAMPLE 3

Example 1 was performed again, using barium acetate (0.43 grams) as the metal complex. The resultant coating contained Si, O and Ba. A water boil test was performed and no weight gain was measured.

EXAMPLE 4

Example 1 was performed again, using zinc acetate ($Zn(OAc)_2$) (0.37 grams) as the metal complex. Elemental analysis of the coating showed amorphous Si—Al—O with Zn. A water boil test was performed and no weight gain was measured.

EXAMPLE 5

20 mL of ammonium phosphate was dissolved in 20 mL of water. Calcium acetate was dissolved in 30 mL of water.

The ammonium phosphate mixture was added to 35 grams of AlN and stirred. The calcium acetate mixture was added to the ammonium phosphate/AlN mixture. The mixture was placed into drying boats and placed in a drying oven at 40° C. for 18 hours. The material was allowed to dry for an additional 24 hours, during which the temperature of the drying oven was increased to 70° C. The sample was fired as in Example 2 above.

EXAMPLE 6

12.12 mL of TEOS was dissolved in 25 mL of methanol. 3.92 grams of deionized water and 5.47 mL of trimethyl borate (TMB) were added to this mixture. The entire mixture was let stand in the hood for about one half hour. 100 grams of aluminum nitride powder was then added to this solution and vigorously mixed for a couple of minutes. The slurry was poured into a Pyrex™ tray and let dry for about 45 minutes, or until the powder had a semi-dry feeling to the touch. The Pyrex tray was wrapped with Saran Wrap™ and let age in the hood for about 18 hours. The powder was placed in an alumina crucible and ramped to 120° C. in 90 minutes, followed by a 120° C. soak for 90 additional minutes. After the powder was cooled down, it was placed in a baking oven and baked using the following baking process: Ramp to 120° C. in 6 hours; soak at 120° C. for 90 minutes; ramp to 550° C. in 2 hours; soak at 550° C. for 90 minutes and cool down to room temperature in one hour. The baked powder was then sieved using a 140 mesh screen, and 25 grams of this powder was placed in a 500 mL round-bottom boiling flask. The weight of the powder and the combined weight of the powder and the flask were carefully measured and noted. 100 mL of deionized water was added and the powder was then boiled for 24 hours using a reflux condenser. The boiling flask was then placed in a drying oven at 100° C. where the water was evaporated and the powder dried for 24 hours. The weight of the powder and the flask were measured again. From the difference in weights before and after boiling the powder, the weight gain, if there was any, was determined. The following weights were recorded in the boiling water test:

Weight of the powder used for the test: 25.02 grams

Weight of the powder and the flask before boiling: 171.53 grams

Weight of the powder and the flask after boiling and drying: 171.35 grams

New Weight change: −0.18 grams

Percent weight gain: −0.72 percent

EXAMPLE 7

1.27 grams of $La(NO_3)_3.6H_2O$ was dissolved in 10 mL ethanol and added to a slurry of 5 grams of AlN in ethanol and stirred for one hour. The mixture was allowed to sit overnight to allow the ethanol to evaporate. The material was then placed in a tube furnace for 45 minutes and heated to about 200° C. to help drive off the residual ethanol. After 45 minutes, the temperature of the unit was increased to 600° C. and held for 2 hours under atmospheric conditions. The furnace was allowed to cool. Analytically, it was determined that an amorphous coating of La—Al—O was present in variable thickness of up to about 1000 Angstroms.

EXAMPLE 8

5.0 grams of boron nitride powder was mixed on a mixing plate with 2.08 grams (2.23 mL) of tetraethylorthosilicate and 20 mL of ethanol in a beaker for one hour. After one hour of mixing, the beaker was removed from the mixing plate and placed in the back of a hood for drying. The mixture was allowed to dry overnight, and then the dried powder was fired in a tube furnace with 100 percent nitrogen flow at a temperature of 850° C. for one hour. A coated boron nitride powder resulted which passed the water boil test.

What is claimed is:

1. A process for preparing a coated nitride powder, comprising contacting nitride powder with at least one silicon compound and at least one material selected from the group consisting of a metal complex, an organo-aluminum material, and mixtures thereof and applying a heat treatment such that the coated nitride powder is formed having a moisture resistant coating, wherein the silicon compound is selected from the group consisting of a tetraalkyl silicate, metallic silicate and metallic fluorosilicate and the silicon compound is combined with a silane coupling agent.

2. The process of claim 1 wherein the nitride powder is silicon nitride, boron nitride, aluminum nitride or mixtures thereof.

3. The process of claim 2 wherein the nitride powder is aluminum nitride.

4. The process of claim 1 wherein the contacting occurs in a solvent.

5. The process of claim 4 wherein the solvent is ethanol, methanol, cyclohexanol, phenol, benzyl alcohol or mixtures thereof.

6. The process of claim 4 wherein the solvent is removed.

7. The process of claim 1 wherein the metal complex contains at least one metal selected from the group consisting of an alkali earth metal, an alkaline earth metal, a transition metal, a rare earth metal, a lanthanide, a group IIIA element, a group IVA element and a VA element.

8. The process of claim 7 wherein the metal complex has at least one anionic species selected from the group consisting of nitrate, acetate, fluoride, borate, phosphate, chloride, bromine, and iodine.

9. The process of claim 8 wherein the total amount of the silicon compound, metal complex, organo-aluminum material or mixtures thereof present is about 1 weight percent to about 10 weight percent, based on the weight of the nitride powder.

10. The process of claim 1 wherein the coated nitride powder is thermally treated at about 350° C. to about 1500° C.

11. The process of claim 1 wherein the silane coupling agent is vinyltrimethoxysilane, chloropropyltrimethoxysilane, 3-glycidoxypropyltrimethoxysilane, 3-methacyloxypropyltrimethoxysilane, 3-aminopropyltriethoxysilane, N-2-aminoethyl-3-aminopropyltrimethoxysilane, 3 mercaptopropyltrimethoxysilane, 3-(N-styrylmethyl-2-aminoethylamino)propyltrimethoxysilane hydrochloride, beta-(3,4-epoxycyclohexyl)ethyltrimethoxysilane or mixtures thereof.

12. A coated nitride powder made by the process of claim 1.

13. The coated nitride powder of claim 12 wherein the nitride powder is aluminum nitride, boron nitride, silicon nitride or mixtures thereof.

14. The coated nitride powder of claim 13 wherein the nitride powder is aluminum nitride.

15. The coated nitride powder of claim 12 wherein the total amount of the silicon compound, metal complex, organo-aluminum material or mixtures thereof present is about 1 weight percent to about 10 weight percent of the coated nitride powder.

16. A coated nitride powder comprising a nitride powder that has a moisture resistant coating of (i) a silicon compound, (ii) a silane coupling agent and (iii) a metal complex, an organo-aluminum material or mixtures thereof, wherein the silicon compound is selected from the group consisting of a tetraalkyl silicate, metallic silicate and metallic fluorosilicate.

17. The coated nitride powder of claim 16 wherein the silicon compound is a tetraalkyl silicate, metallic silicate, metallic fluorosilicate or mixture thereof.

18. The coated nitride of claim 17 wherein the silane coupling agent is vinyltrimethoxysilane, chloropropyltrimethoxysilane, 3-glycidoxypropyltrimethoxysilane, 3-methacyloxypropyltrimethoxysilane, 3-aminopropyltriethoxysilane, N-2-aminoethyl-3-aminopropyltrimethoxysilane, 3 mercaptopropyltrimethoxysilane, 3-(N-styrylmethyl-2-aminoethylamino)propyltrimethoxysilane hydrochloride, beta-(3,4-epoxycyclohexyl)ethyltrimethoxysilane or mixtures thereof.

19. The coated nitride of claim 16 wherein the coated nitride powder has been thermally treated at about 350° C. to about 1500 ° C.

20. A coated nitride powder having a moisture resistant coating of a silicon compound and an organo-aluminum compound wherein the silicon compound is selected from the group consisting of a tetraalkyl silicate, metallic silicate and metallic fluorosilicate.

* * * * *